United States Patent
Takahashi

(10) Patent No.: US 12,033,869 B2
(45) Date of Patent: Jul. 9, 2024

(54) METHOD OF ETCHING OBJECT AND ETCHING DEVICE

(71) Applicant: FLOSFIA INC., Kyoto (JP)

(72) Inventor: Isao Takahashi, Kyoto (JP)

(73) Assignee: FLOSFIA INC., Kyoto (JP)

( * ) Notice: Subject to any disclaimer, the term of this patent is extended or adjusted under 35 U.S.C. 154(b) by 105 days.

(21) Appl. No.: 16/910,480

(22) Filed: Jun. 24, 2020

(65) Prior Publication Data

US 2020/0411331 A1 Dec. 31, 2020

(30) Foreign Application Priority Data

Jun. 28, 2019 (JP) ................. 2019-121727

(51) Int. Cl.
| | | |
|---|---|---|
| *H01L 21/465* | (2006.01) | |
| *H01L 21/67* | (2006.01) | |
| *H01L 29/66* | (2006.01) | |
| *H01L 29/78* | (2006.01) | |
| *H01L 29/872* | (2006.01) | |

(52) U.S. Cl.
CPC ........ *H01L 21/465* (2013.01); *H01L 21/6708* (2013.01); *H01L 29/66969* (2013.01); *H01L 29/7802* (2013.01); *H01L 29/872* (2013.01)

(58) Field of Classification Search
CPC .............. H01L 21/465; H01L 21/6708; H01L 29/66969; H01L 29/7802; H01L 29/872; H01L 29/24; H01L 29/66666; H01L 29/7828; H01L 29/0619
See application file for complete search history.

(56) References Cited

U.S. PATENT DOCUMENTS

| | | | | |
|---|---|---|---|---|
| 2002/0146888 A1* | 10/2002 | Ryu | .................. | H01L 21/02639 |
| | | | | 257/E29.267 |
| 2008/0182207 A1* | 7/2008 | Yamazaki | ........... | H01L 27/1288 |
| | | | | 430/311 |
| 2009/0049653 A1* | 2/2009 | Watanabe | ............ | B01D 9/0027 |
| | | | | 422/245.1 |
| 2015/0194479 A1 | 7/2015 | Kaneko et al. | | |
| 2017/0253479 A1* | 9/2017 | Nikoobakht, IV | .......................... | |
| | | | | H01L 21/3245 |
| 2017/0373193 A1 | 12/2017 | Yamazaki et al. | | |
| 2018/0090336 A1* | 3/2018 | Li | ...................... | H01L 21/02381 |
| 2018/0337306 A1* | 11/2018 | Matsumoto | ............. | C23C 16/34 |
| 2018/0356729 A1* | 12/2018 | Tanigaki | ............... | G03F 7/0007 |

(Continued)

FOREIGN PATENT DOCUMENTS

| | | | | | | |
|---|---|---|---|---|---|---|
| CN | 104517827 A | * | 4/2015 | ......... | H01L 21/0254 |
| CN | 105702606 A | * | 6/2016 | ............. | H01L 27/32 |
| CN | 106299031 A | * | 1/2017 | ............. | H01L 27/32 |

(Continued)

OTHER PUBLICATIONS

Kaneko, Kentaro, "Growth and Physical Properties of Corundum-Structured Gallium Oxide Alloy Thin Films", Dissertation, Kyoto Univ., Mar. 2013, pp. 1-116 with Abstract.

(Continued)

*Primary Examiner* — Mohammed Shamsuzzaman
(74) *Attorney, Agent, or Firm* — Wenderoth, Lind & Ponack, L.L.P.

(57) ABSTRACT

In a first aspect of a present inventive subject matter, a method of etching includes etching an object at a temperature that is higher than 200° C. with atomized droplets of an etching liquid.

11 Claims, 6 Drawing Sheets

(56) References Cited

U.S. PATENT DOCUMENTS

2019/0302617 A1 * 10/2019 Matsuki .................. G03F 7/105

FOREIGN PATENT DOCUMENTS

| CN | 106684174 | A | * | 5/2017 | ............ H01L 27/32 |
| CN | 104599950 | B | * | 9/2017 | ....... H01L 21/31058 |
| CN | 109920747 | A | * | 6/2019 | ............ H01L 27/32 |
| CN | 107879638 | B | * | 4/2020 | ............ C03B 23/02 |
| CN | 112151387 | A | * | 12/2020 | ........... H01L 21/465 |
| CN | 112875742 | A | * | 6/2021 | ............ H01L 27/32 |
| JP | H02-260636 | | | 10/1990 | |
| JP | 2004247584 | A | * | 9/2004 | ............ H01L 27/32 |
| JP | 2009-010033 | | | 1/2009 | |
| JP | 2010-067826 | | | 3/2010 | |
| JP | 2011-181784 | | | 9/2011 | |
| JP | 2018-140352 | | | 9/2018 | |
| JP | 6462699 | B2 | * | 1/2019 | ............ C09K 13/00 |
| JP | 2020035988 | A | * | 3/2020 | ............ H01L 27/32 |
| JP | 2021163946 | A | * | 10/2021 | ............ H01L 27/32 |
| JP | 6986862 | B2 | * | 12/2021 | ......... H01L 27/1218 |
| TW | 202208704 | A | * | 3/2022 | ......... C23C 16/0236 |
| WO | WO-03015145 | A1 | * | 2/2003 | ......... B81C 1/00531 |
| WO | WO-2008075615 | A1 | * | 6/2008 | ......... H01L 51/5048 |
| WO | WO-2019033975 | A1 | * | 2/2019 | ............ C30B 25/183 |
| WO | WO-2019043947 | A1 | * | 3/2019 | ............ H01L 27/32 |
| WO | WO-2020044927 | A1 | * | 3/2020 | ............ H01L 27/32 |

OTHER PUBLICATIONS

Notice of Reasons for Refusal dated Jun. 6, 2023 in Japanese Patent Application No. 2019-121727, with English language translation.
English language translation of Office Action issued Jan. 8, 2024 in Taiwanese Patent Application No. 109121657.

* cited by examiner (a)

(b)

(c)

METHOD OF ETCHING OBJECT AND ETCHING DEVICE

CROSS-REFERENCE TO RELATED APPLICATION

This application is a new U.S. patent application that claims priority benefit of Japanese patent application No. 2019-121727 filed on Jun. 28, 2019, the disclosure of which is incorporated herein by reference in its entirety.

BACKGROUND OF THE INVENTION

Field of the Invention

The present disclosure relates to a method of etching an object. Also, the present disclosure relates to an etching device.

Description of the Related Art

As a switching device of next generation achieving high withstand voltage, low losses and high-temperature resistance, semiconductor devices using gallium oxide ($Ga_2O_3$) with a wide band gap attract attention and are expected to be applied to power semiconductor devices including an inverter, and also, due to the wide band gap, are expected to be applied to light-emitting and/or receiving devices. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refer to $In_XAl_YGa_ZO_3$ ($0 \leq X \leq 2$, $0 \leq Y \leq 2$, $0 \leq Z \leq 2$, X+Y+Z=1.5 to 2.5) and can be viewed as the same material system containing gallium oxide.

However, there is a problem that gallium oxide is difficult to be etched even if an etching liquid such as hydrogen fluoride (HF) is used. A technique, in which an etching process is performed by spraying a liquid material on an object such as a substrate, a semiconductor film, or an insulation film, for example, is known. Also, a method of performing etching treatment using atomized liquid material (mist) on an object to be etched has been tried. In recent years, in manufacturing processes of semiconductor devices and electronic equipment, since patterning even submicron order is performed, for example, coating gaps is sometimes difficult even when mist is used. Accordingly, a method for etching treatment of an object with nano-level control of etching, which is useful for manufacturing semiconductor device and electronic equipment, etc., has been awaited.

Patent Document 1 describes an etching treatment in which spraying micro-mist having an average particle size of 10 µm or less on a surface of a semiconductor wafer to perform etching for dissolving and removing existing structures on the wafer. However, the method of etching described in the Patent Document 1 is not sufficient to perform etching of gallium oxide, and thus, a suitable method of etching of gallium oxide has been awaited.

Patent Document 2 describes a mist etching device, and etching treatment is performed on an object such as zinc oxide by use of etching liquid composed of etching material of hydrochloric acid or a mixture of hydrochloric acid and nitric acid and a solvent composed of pure water. However, the etching method described in the Patent Document 2 is difficult to suitably perform etching gallium oxide, and amount of etching was little, and thus, a suitable method of etching gallium oxide has been awaited.

CITATION LIST

Patent Literature

PTL1: JP2009-010033
PTL2: JP2011-181784

Non-Patent Literature

NPL 1: Kaneko, Kentaro, "Fabrication and physical properties of corundum structured alloys based on gallium oxide", Dissertation, Kyoto Univ., March 2013.

SUMMARY OF THE INVENTION

In a first aspect of a present inventive subject matter, a method of etching includes etching an object at a temperature that is higher than 200° C. with atomized droplets of an etching liquid.

According to an embodiment of the present disclosure, the object may contain at least aluminum. Also, according to an embodiment of the present disclosure, the object may contain at least gallium. Furthermore, the object may contain at least gallium and aluminum. The object may have a corundum structure. Furthermore, in embodiments of the present disclosure, the object is of $\alpha\text{-}Ga_2O_3$.

According to an aspect of the present disclosure, the etching liquid contains bromine. Also, according to another aspect of the present disclosure, the etching liquid contains hydroxide. The etching liquid may contain an alkali metal and/or an alkaline-earth metal.

According to embodiments of the present disclosure, the temperature of the object is 400° C. or higher while the object is being etched. According to some embodiments of the present disclosure, the etching of the object includes reforming a surface of the object.

In the first aspect of the present inventive subject matter, the method of etching may further include generating the atomized droplets to be floating from the etching liquid; and supplying the atomized droplets with a carrier gas to carry the atomized droplets by the carrier gas onto the object. According to embodiments of the present inventive subject matter, the carrier gas is an inert gas.

In a second aspect of the present inventive subject matter, a method of manufacturing a semiconductor device, the method includes generating atomized droplets from an etching liquid; supplying the atomized droplets with a carrier gas to carry the atomized droplets by the carrier gas onto an object; and etching the object with the atomized droplets at a temperature higher than 200° C.

The etching liquid may contain at least one selected from among bromide, a hydroxide, an alkali metal and an alkaline-earth metal.

According to embodiments of the present disclosure, the temperature of the object is 400° C. or higher while the object is being etched. The carrier gas may be an inert gas. According to embodiments of the present disclosure, the etching of the object may include reforming a surface of the object.

In a third aspect of the present inventive subject matter, an etching device includes a generator of atomized droplets to generate atomized droplets from an etching liquid; a connector; and a chamber of etching includes a heater. The connector connects the generator of the atomized droplets and the chamber of etching. The atomized droplets are carried with the carrier gas from the generator of the atomized droplets to the chamber of etching. The chamber of etching is configured to hold the atomized droplets at least during etching an object. Also, the etching device may further include a carrier gas supply device that is connected to the generator of the atomized droplets. The carrier gas supply device may be configured to supply a carrier gas to the atomized droplets in the generator.

In a fourth aspect of the present inventive subject matter, a method of etching includes reforming a surface of an object at a temperature that is higher than 200° C. with atomized droplets of an etching liquid.

DETAILED DESCRIPTION OF EMBODIMENTS

Figure 1:
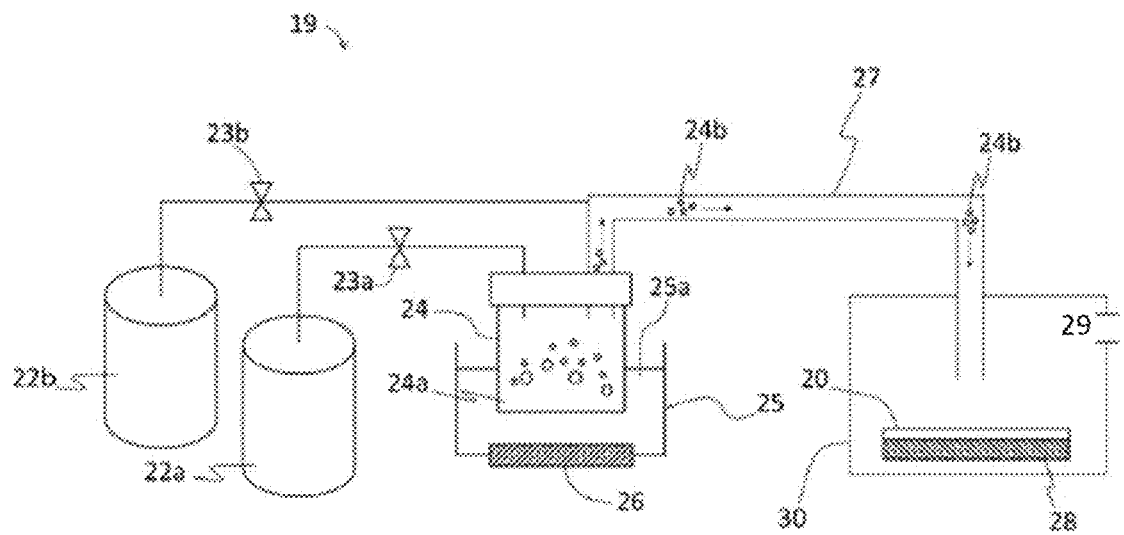
FIG. 1 shows a schematic diagram of an etching device used in Practical Examples.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a device, and/or a system in addition to the orientation depicted in the figures.

An object of the present inventive subject matter is to provide a method of etching an object, even if the object is of gallium oxide, for example. In a first aspect of a present inventive subject matter, a method of etching includes etching an object at a temperature that is higher than 200° C. with atomized droplets of an etching liquid. In embodiments of the present inventive subject matter, since etching of the object is performed with atomized droplets of an etching liquid, it is possible to safely control the amount of etching of the object even at such a high temperature.

The present inventors have intensively studied in order to achieve the above object, found that in a method of etching an object using an etching liquid at a temperature of 200° C. or higher with a mist Chemical Vapor Etching (CVE) method, it was found that etching can be suitably performed even on gallium oxide that is difficult to be etched, and such a method of etching is able to solve a conventional problem(s).

Further, the present inventors, after obtaining the above findings, have resulted in completing the present inventive subject matter by carrying out further studies. Also, as another object of the present inventive subject matter, an etching device is provided.

A method of etching of the present inventive subject matter specifically includes etching an object at a temperature that is higher than 200° C. with atomized droplets containing an etching liquid.

(Etching Liquid)

The etching liquid is not particularly limited as long as the etching liquid is able to etch the object at a temperature higher than 200° C. and is able to be atomized or formed into droplets. The etching liquid may contain an inorganic material and may contain an organic material. In a first aspect of the present inventive subject matter, the etching liquid preferably contains bromine for etching efficiently, and more preferably contains hydrogen bromide. Also, in a second aspect of the present inventive subject matter, the etching liquid preferably contains a hydroxide, and an alkali metal or alkaline-earth metal. Also, the solvent of the etching liquid is not particularly limited, however, the solvent is preferably an inorganic solvent, further preferably a polar solvent, and most preferably water. The concentration of the etching liquid is not particularly limited, however, is preferably 5% or higher in volume ratio to the solvent of the etching liquid, and further preferably 10% or higher, and most preferably 20%. The upper limit of the concentration is not particularly limited as long as the etching liquid has a concentration able to be atomized or formed into droplets.

(Atomized Droplets)

The atomized droplets are not particularly limited as long as the atomized droplets are atomized and formed from the etching liquid. Atomization or forming into droplets are preferably to generate atomized droplets by atomizing the etching liquid to be floating. In the present inventive subject matter, a method of generating atomized droplets is preferably a method using ultrasonic waves. Atomized droplets obtained by using ultrasonic waves become floating with the initial velocity that is zero, and that is preferable. Since atomized droplets that are floating are carriable as gas, the atomized droplets that are floating are significantly preferable to avoid damage caused by the collision energy without being blown like a spray. In the present inventive subject matter, the atomized droplets are preferably atomized from the etching liquid and carriable with carrier gas.

(Object to be Etched)

The object to be etched is not particularly limited as long as the object is able to be etched with the atomized droplets. Material(s) of the object to be etched is not particularly limited as long as the material(s) is not interfered with the object of the present inventive subject matter, and may be a known material, and may be an organic compound or may be an inorganic compound. The shape of the object to be etched is not particularly limited, may be any shape and effective for any shape, for example, a plate shape such as a flat plate shape or a disk shape, a film shape, a fibrous shape, a shape of rod, a cylindrical shape, a prismatic shape, a tube shape, a spiral shape, a spherical shape, and a ring shape, etc. are mentioned as examples. In the present inventive subject matter, the object to be etched preferably has a film shape. In aspects of the present inventive subject matter, the object to be etched preferably contains at least aluminum or/and gallium, further preferably contains an oxide containing aluminum or/and gallium, more preferably contains aluminum oxide and/or gallium oxide, and most preferably contains gallium oxide. Further, the object to be etched is preferably a crystal, more preferably has a corundum structure, a β-gallia structure, or a hexagonal structure, and most preferably has a corundum structure.

According to embodiments of the present inventive subject matter, the object to be etched contains $\alpha\text{-}Ga_2O_3$ as a major component. The term "major component" herein means that, the object to be etched contains $\alpha\text{-}Ga_2O_3$ such that the atomic ratio of $\alpha\text{-}Ga_2O_3$ in all components contained in the object to be etched is preferably 50% or more, further preferably 70% or more, more preferably 90% or more, and may be 100%, for example.

The object to be etched may be integrated with a base or the like, and in embodiments of the present inventive subject matter, the object preferably has a layered structure, and directly or through other layer(s) on the base. The base is not particularly limited as long as the base can support the object to be etched. Material(s) of the base is not particularly limited as long as an object of the present inventive subject matter is not interfered with, and may be a known base, and may be of an organic compound or of an inorganic compound. The shape of the base is not particularly limited, may be any shape and effective for any shape, for example, a plate shape such as a flat plate shape or a disk shape, a film shape, a fibrous shape, a shape of rod, a cylindrical shape, a prismatic shape, a tube shape, a spiral shape, a spherical shape, and a ring shape, etc. are mentioned as examples, however, in the present inventive subject matter, the base is preferably a substrate. The thickness of the substrate is not particularly limited in the present inventive subject matter.

The substrate is not particularly limited as long as the substrate has a plate shape and can support the object to be etched. The substrate may be an insulation substrate, a semiconductor substrate, or an electrically-conductive substrate, however, preferably an insulation substrate, and also preferable an insulation substrate with a metal film formed on a surface of the insulation substrate. As the substrate, a substrate having a corundum structure or the like is a preferable example. Material(s) of the substrate is not particularly limited, and may be a known one. As the substrate having a corundum structure, a substrate having a material with a corundum structure, at least at a part of a surface of the substrate, may be used. Also, the substrate may be a base substrate containing as a major component a substrate material having a corundum structure, and more specifically, a sapphire substrate (preferably, a c-plane sapphire substrate) and an α-phase gallium oxide substrate may be mentioned as examples. The term "major component" herein means that, a substrate material having the specific crystal structure is contained in the substrate such that the atomic ratio of the substrate material having the specific crystal structure in all components contained in the substrate is preferably 50% or more, further preferably 70% or more, more preferably 90% or more, and may be 100%. A known method may be used for arranging the object on the base.

In the present inventive subject matter, etching the object to be etched at a temperature higher than 200° C. with the atomized droplets of the etching liquid. The etching is not particularly limited, as long as etching is able to be performed at a temperature higher than 200° C. In the present inventive subject matter, the temperature of the etching treatment is preferably 400° C. or higher. Also, in the present inventive subject matter, the etching treatment is preferably performed by reaction of the atomized droplets on the object to be etched.

In the present inventive subject matter, carrying the atomized droplets with carrier gas is preferable. The carrier gas is not particularly limited as long as an object of the present inventive subject matter is not interfered with, and thus, examples of the carrier gas may include oxygen, ozone, an inert gas such as nitrogen, argon, etc., and a reducing gas such as a hydrogen gas, a forming gas, etc. The type of carrier gas may be one or two or more, and a dilution gas (e.g., 10-fold dilution gas) at a reduced flow rate and the like may be used further as a second carrier gas. The carrier gas may be supplied from one or two or more locations. While the flow rate of the carrier gas is not particularly limited, the flow rate of the carrier gas may be in a range of 0.01 L/min to 20 L/min, and further preferably in a range of 1 L/min to 10 L/min. When a dilution gas is used, the flow rate of the dilution gas is preferably in a range of 0.001 L/min to 2 L/min, and further preferably 0.1 L/min to 1 L/min.

The reaction may be any reaction capable of etching the object to be etched with the atomized droplets, and may include a chemical reaction or may include a thermal reaction by heat. In the present inventive subject matter, the etching treatment is performed at a temperature higher than 200° C., preferably 350° C. or higher, and further preferably 400° C. or higher. In the present inventive subject matter, even at such a high temperature, it is possible to etch the object to be etched stably and sufficiently with the atomized droplets of the etching liquid. The upper limit is not particularly limited as long as an object of the present inventive subject matter is not interfered with, however, 1900° C. or less is preferable, and 1400° C. or less is further preferable. Also, the reaction may be conducted in any atmosphere of a vacuum, a non-oxygen atmosphere, a reducing-gas atmosphere, and an oxygen atmosphere as long as an object of the present inventive subject matter is not interfered with, however, the reaction is preferably conducted under a non-oxygen atmosphere or an oxygen atmosphere, and more preferably conducted under an inert gas atmosphere. Also, the reaction may be conducted in any condition of under an atmospheric pressure, under an increased pressure, and under a reduced pressure, however, in the present disclosure, the reaction is preferably conducted under an atmospheric pressure. Furthermore, the amount of etching is able to be set by adjusting etching time.

The method of etching, for example, by an etching device including a generator of atomized droplets by generating atomized droplets from an etching liquid to be floating, a transport section carrying the atomized droplets generated in the generator of the atomized droplets, and an etching section for etching the object to be etched including a heater that is able to raise the temperature of the object to higher than 200° C. The transport section is a connector that connects the generator of the atomized droplets and the etching section. The etching section may be a chamber of etching. The atomized droplets are carried with the carrier gas from the generator of the atomized droplets to the chamber of etching.

In the present inventive subject matter, it is preferable that the etching section is provided with a heater that is configured to heat the object to be etched at a temperature of 400° C. or higher. Also, in the present inventive subject matter, it is also preferable that the heater is a hot plate. Furthermore, in the present inventive subject matter, the etching section preferably has a structure for holding the atomized droplets. According to this preferable aspect, it is possible to provide more enhanced amount of etching in quality than the device described in the Patent Document 2.

The method of etching is applicable to manufacturing process(es) of various products, and preferably applicable to manufacturing process(es) of semiconductor devices. Examples of the semiconductor devices include diodes, transistors, and junction barrier Schottky diode (JBS). Other than the aforementioned semiconductor devices, for example, a digital camera, a printer, a projector, a personal computer, a CPU-mounted electronic device such as a mobile phone or the like, a vacuum cleaner, an electronic device equipped with a power unit such as an iron or the like, a motor, a drive mechanism, an electric vehicle, an electric plane, a drive electronic device such as a small electric device or a micro-electromechanical system (MEMS) and the like may be mentioned.

Hereinafter, the method of etching of the present disclosure will be described in more details with reference to an example of manufacturing a product (semiconductor device) by applying the method of etching to a process of the manufacturing the product (semiconductor device), however, the present inventive subject matter is not limited thereto.

Figure 5:
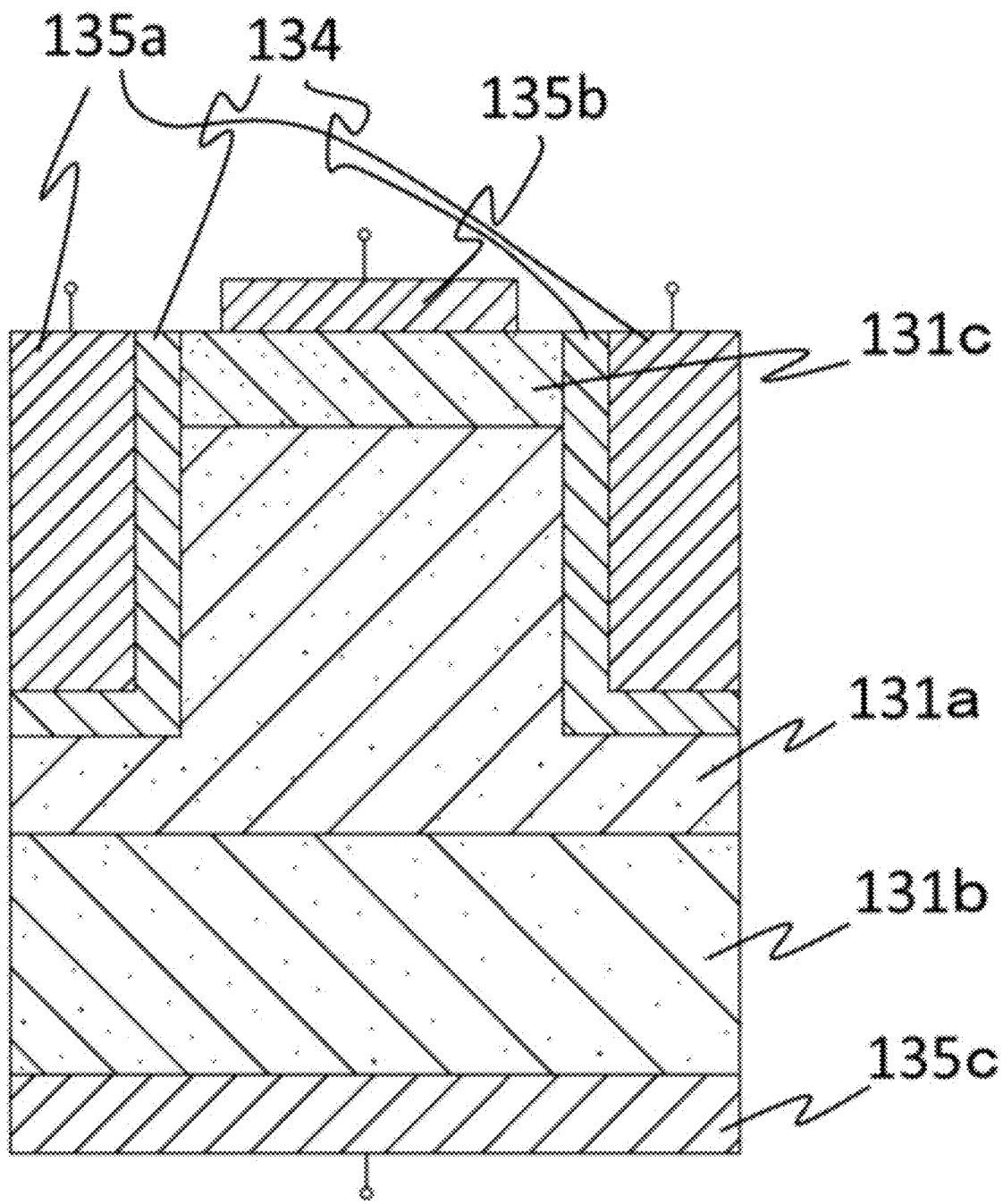
FIG. 5 is a schematic diagram illustrating a cross sectional view of a metal-oxide-semiconductor field-effect transistor (MOSFET) as an example of a manufacturing example.

FIG. 5 is a schematic diagram illustrating a cross sectional view of a metal-oxide-semiconductor field-effect transistor (MOSFET) as an example in a manufacturing example to that the method of etching of the present inventive subject matter is applied. MOSFET of FIG. 5 is a trench MOSFET including an $n^-$-type semiconductor layer 131a, a first $n^-$-type semiconductor layer 131b, a second $n^+$-type semiconductor layer 131c, a gate insulation film 134, a gate electrode 135a, a source electrode 135b, and a drain electrode 135c. On the drain electrode 135c, for example, the first $n^+$-type semiconductor layer 131b that has a thickness of 100 nm to 100 µm is formed, and on the first $n^+$-type semiconductor layer 131b, for example, the $n^-$-type semiconductor layer 131a that has a thickness of 100 nm to 100 µm is formed. Also, on the $n^-$-type semiconductor layer 131a, the second $n^+$-type semiconductor layer 131c is formed, and on the second $n^+$-type semiconductor layer 131c, the source electrode 135b is formed.

In the $n^-$-type semiconductor layer 131a and the second $n^+$-type semiconductor layer 131c, trenches penetrating the second $n^+$-type semiconductor layer 131c and reaching the middle of $n^-$-type semiconductor layer 131a are formed. In each of the trenches, for example, a gate electrode 135a is buried through a gate insulation film 134 having a thickness of 10 nm to 1 µm in the trench, for example.

Figure 6:
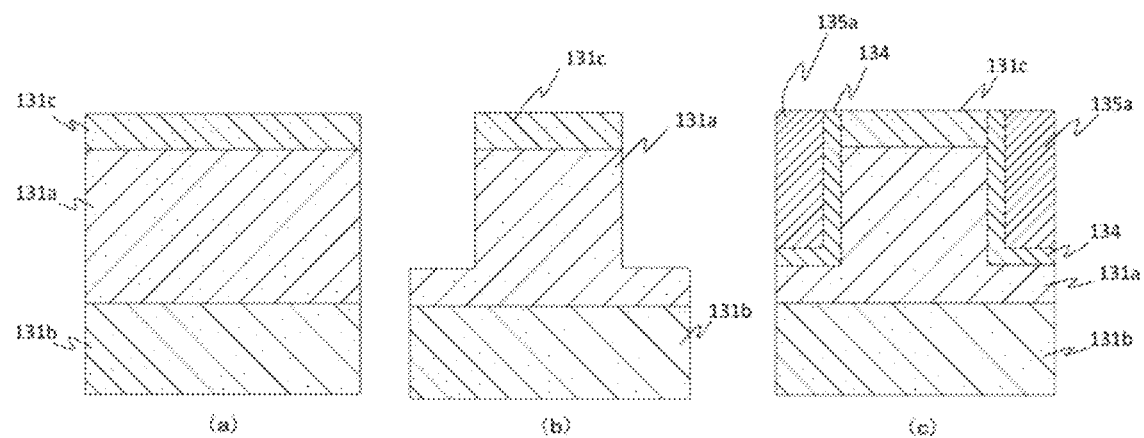
FIG. 6 is a schematic diagram illustrating a cross sectional view of a metal-oxide-semiconductor field-effect transistor (MOSFET) to explain an example of a manufacturing process.

FIG. 6 shows a part of the manufacturing process of the MOSFET shown in FIG. 5. For example, using a semiconductor structure shown in FIG. 6(a), etching is performed, by arranging a mask for etching on a predetermined region of the $n^-$-type semiconductor layer 131a and the second $n^+$-type semiconductor layer 131c, and etching is performed by the etching method of the present inventive subject matter using the mask for etching as a mask, and as shown in FIG. 6(b), trench(es) penetrating from a surface of the second $n^+$-type semiconductor layer 131c and reaching the middle of $n^-$-type semiconductor layer 131a are formed. Conditions of the etching liquid and etching are described as the above. When each of the second $n^+$-type semiconductor layer 131c and the $n^-$-type semiconductor layer 131a contains $\alpha$-$Ga_2O_3$ as a major component, devices containing $\alpha$-$Ga_2O_3$ can be manufactured more industrially advantageously by etching with an etching liquid containing bromine as the etching liquid according to the method of the present inventive subject matter. Next, as shown in FIG. 6(c), after a gate insulation film 134 having a thickness of, for example, 50 nm to 1 µm is formed on the side surface and the bottom surface of the trench by a known method such as a thermal oxidation method, a vacuum evaporation method, a sputtering method, or a CVD method, for example, a gate electrode material 135a such as polysilicon is formed in the trench by a CVD method, a vacuum evaporation method, a sputtering method, or the like to have a thickness equal to or less than the thickness of the $n^-$-type semiconductor layer.

Then, by forming the source electrode 135b on the $n^+$-type semiconductor layer 131c and forming the drain electrode 135c on the $n^+$-type semiconductor layer 131b using a known method such as a vacuum evaporation method, a sputtering method, or a CVD method, the power MOSFET can be manufactured. Material(s) for the source electrode and the drain electrode may be of known electrode material(s). Examples of such an electrode material include a metal, such as aluminum (Al), molybdenum (Mo), cobalt (Co), zirconium (Zr), tin (Sn), niobium (Nb), iron (Fe), Cr (chromium), Ta (tantalum), Ti (titanium), Au (gold), Pt (platinum), V (vanadium), Mn (manganese), Ni (nickel), Cu (copper), Hf (hafnium), W (tungsten), Ir (Iridium), Zn (zinc), In (indium), Pd (palladium), Nd (neodymium), and/or Ag (silver), and an alloy selected therefrom. Also, examples of the electrode material further include metal oxide conductive films of tin oxide, zinc oxide, indium oxide, indium tin oxide (ITO), and indium zinc oxide (IZO), organic conductive compounds, such as polyaniline, polythiophene, and polypyrrole, and mixtures selected therefrom.

Figure 7:
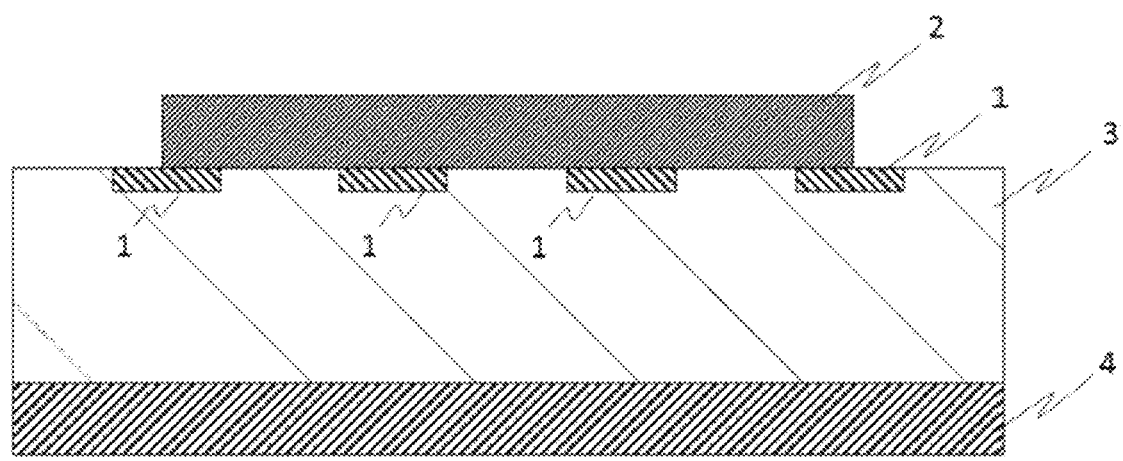
FIG. 7 is a schematic diagram illustrating a cross sectional view of a junction barrier Schottky diode (JBS) in a manufacturing example.

FIG. 7 is a schematic diagram illustrating a cross sectional view of a junction barrier Schottky diode (JBS) in a manufacturing example to which the method of etching of the present inventive subject matter is applied. The semiconductor device of FIG. 7 includes an n-type semiconductor layer 3, an electrode (barrier electrode) 2 capable of forming a Schottky barrier between the n-type semiconductor layer 3 and the electrode (barrier electrode) 2, and a p-type semiconductor 1 that is arranged between the electrode (barrier electrode) 2 and the n-type semiconductor layer 3 and capable of forming a Schottky barrier between the p-type semiconductor 1 and the n-type semiconductor layer 3, the Schottky barrier with a barrier height larger than the barrier height of the Schottky barrier of the electrode (barrier electrode) 2. The p-type semiconductor 1 is buried in the n-type semiconductor layer 3.

Figure 8:
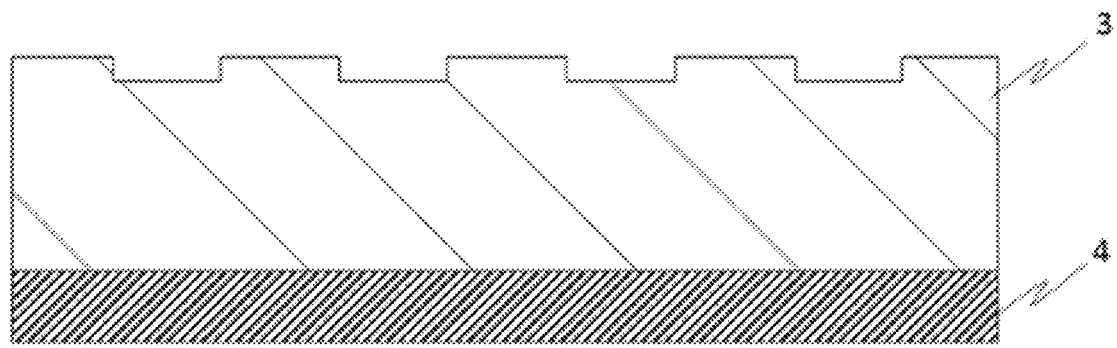
FIG. 8 is a schematic diagram illustrating a cross sectional view of a junction barrier Schottky diode (JBS) to explain an example of a manufacturing process.
Figure 8:
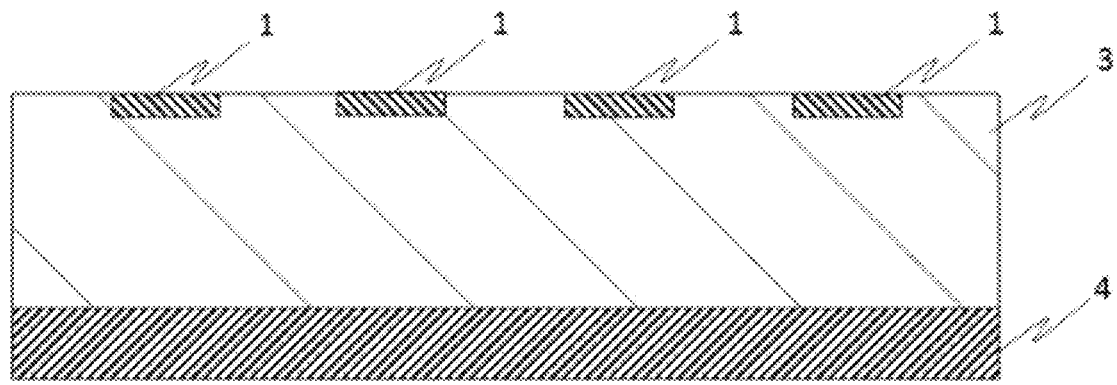
Figure 8:
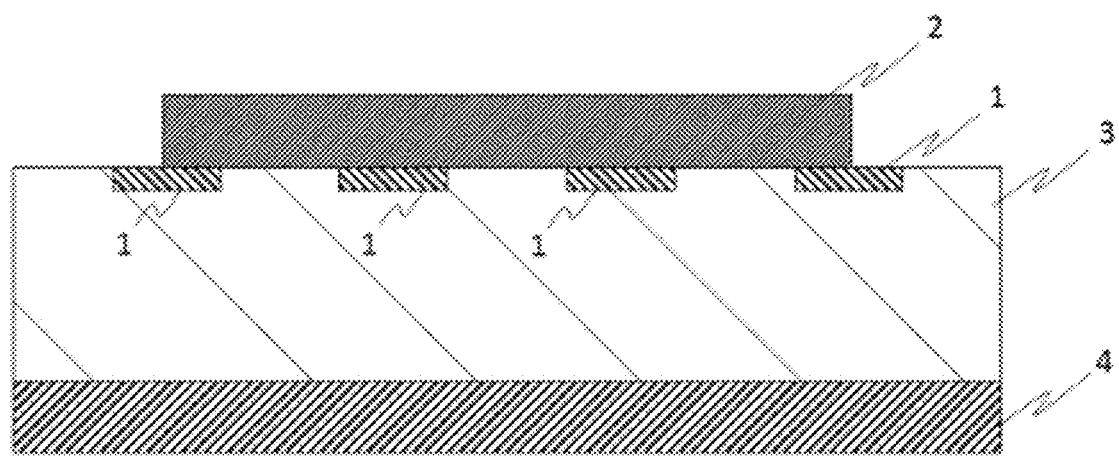

Hereinafter, with reference to FIG. 8, a preferable manufacturing process of a semiconductor device is explained. FIG. 8 (a) shows a layered structure including an ohmic electrode 4 arranged on a semiconductor substrate as an n-type semiconductor layer 3, trenches are formed into the n-type semiconductor layer 3 from the opposite side surface. Then, with respect to the layered structure of FIG. 8 (a), using the method of etching of the present disclosure, after etching is given on the surface of the layered structure to form trench(es), using a photolithography method, as shown in FIG. 8 (b), the p-type semiconductor 1 is formed in the trench(es) of the n-type semiconductor layer 3. After obtaining the layered structure shown in FIG. 8 (b), the layered structure of FIG. 8 (c) is obtained by forming the electrode (barrier electrode) 2 by the dry method (preferably a vacuum deposition method or sputtering) or the wet method or the like, on the p-type semiconductor 1 and the n-type semiconductor layer 3. The method of etching of the present disclosure is, in manufacturing process(es) of semiconductor device, suitably used, even as a pretreatment of each layer prior to regrowth of each layer (semiconductor layer, insulator layer, etc.) of semiconductor device.

PRACTICAL EXAMPLE

Some practical examples according to the present disclosure are explained as follows, however, the present inventive subject matter is not limited thereto.

Practical Example 1

1. Etching Device

With reference to FIG. 1, an etching device 19 used in the Practical Examples. The etching device 19 includes a carrier gas supply device 22a, a flow-control valve 23a to control a flow rate of carrier gas sent from the carrier gas supply device 22a, a carrier gas (dilution) supply device 22b, a flow-control valve 23b to control a flow rate of carrier gas (dilution) sent from the carrier gas (dilution) supply device 22b, a mist generator 24 in that an etching liquid 24a is contained, a container 25 in that water 25a is contained, an ultrasonic transducer 26 that is attached to a bottom surface of the container 25, an etching chamber 30 as an etching section, a supply pipe 27 that is a quartz pipe connecting the mist generator 24 and an etching chamber 30 for etching treatment, a hot plate 28 that is a heater placed in the etching chamber 30, and an object to be etched is set on the hot plate 28, and an exhaust port 29 positioned higher at a wall of the etching chamber 30 to hold the atomized droplets around the object.

2. Preparation of Etching Liquid

An etching liquid was prepared by mixing hydrobromic acid into ultrapure water such that hydrobromic acid becomes 20% in volume ratio.

3. Preparation of Etching

The etching liquid 24a obtained at the above 2. was set in a container of the mist generator 24. Next, a c-plane α-$Ga_2O_3$ film formed on a c-plane sapphire substrate was placed as an object 20 to be etched on the hot plate 28, and the hot plate 28 was activated to raise the temperature of the object up to 365° C. The flow-control valves 23a and 23b were opened and the flow rate of the carrier gas from the carrier gas source 22a was regulated at 2.0 L/min. and the diluted carrier gas from the diluted carrier gas source 22b was regulated at 2.0 L/min. In this embodiment, nitrogen was used as the carrier gas.

4. Etching Treatment

Figure 3:
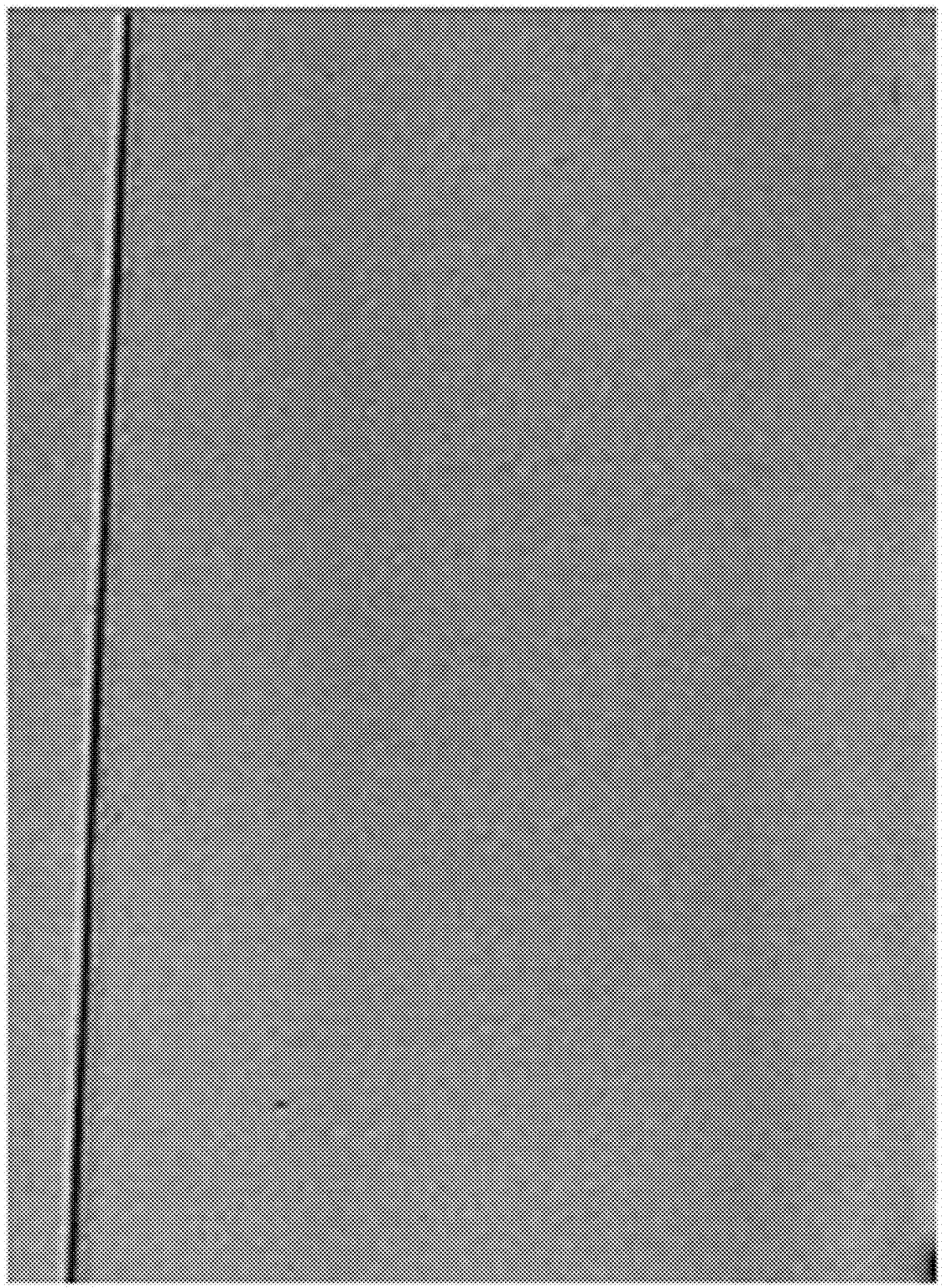
FIG. 3 shows a microscopic image after etching in a Practical Example.

The ultrasonic transducer 26 was then activated to vibrate at 2.4 MHz, and vibrations were propagated through the water 25a to the etching liquid 24a to generate mist (atomized droplets) 24b atomized from the etching liquid 24a. The mist 24b was introduced with the carrier gas through the supply pipe 27 into the etching chamber 30, reacted on the object 20 to be etched at 365° C. under atmospheric pressure, etching was given on the object 20 to be etched. Etching time was one hour. After the etching, the object was observed to confirm presence or absence of crack(s) by a microscope. FIG. 3 shows the microscopic image. As clearly shown in FIG. 3, crack(s) was not generated by etching treatment. The amount of etching was 698 nm.

Practical Example 2

Etching was given by the same conditions as the conditions of the Practical Example 1 except that the etching liquid was prepared by mixing hydrobromic acid into ultrapure water such that hydrobromic acid becomes 30% in volume ratio. The amount of etching was 1277 nm.

Comparative Example 1

Etching was given by the same conditions as the conditions of the Practical Example 1 except that the etching liquid was prepared by mixing hydrochloric acid into ultrapure water such that hydrochloric acid becomes 20% in volume ratio. The amount of etching was 12 nm.

Comparative Example 2

Etching was given by the same conditions as the conditions of the Practical Example 1 except that the etching liquid was prepared by mixing hydrochloric acid into ultrapure water such that hydrochloric acid becomes 30% in volume ratio. The amount of etching was 13 nm.

(Evaluation)

Figure 2:
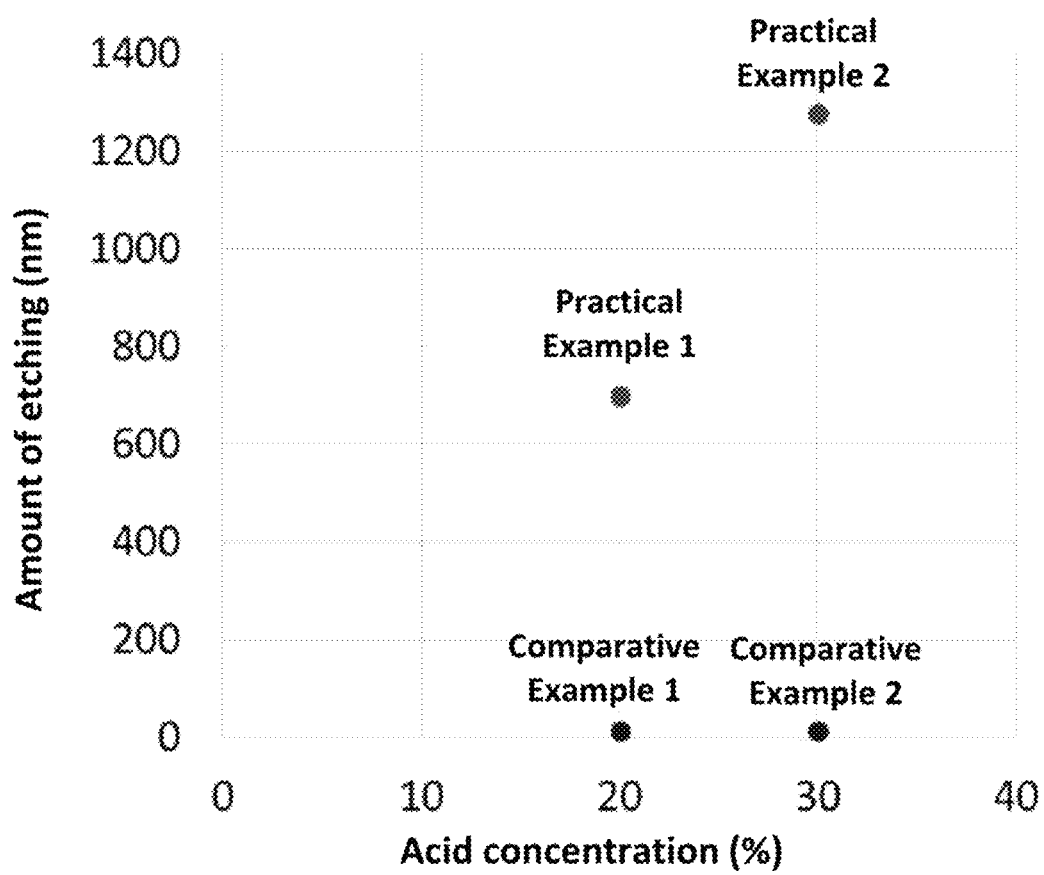
FIG. 2 shows a relationship of amount of etching and concentration of hydrobromic acid in Practical Examples and Comparative Examples.

The amount of etching in each of the Practical Examples 1 and 2 and Comparative Examples 1 and 2 was measured, and FIG. 2 shows the results.

Practical Example 3

Etching was given by the same conditions as the conditions of the Practical Example 2 except that the temperature of etching was 400° C. The amount of etching was 1473 nm, and etching appearance was favorable. Same as the Practical Example 1, the object was observed to confirm presence or absence of crack(s) by a microscope, and crack(s) was not generated by etching.

Practical Example 4

Etching was given by the same conditions as the conditions of the Practical Example 1 except that an r-plane α-$Ga_2O_3$ film formed on an r-plane sapphire substrate was used as the object to be etched. The amount of etching was 313 nm. Surface roughness (Ra) before and after the etching of the object was examined by an atomic force microscopy (AFM) observation and the surface state of the object was evaluated. As the result, the surface roughness (Ra) before the etching was 35.9 nm, whereas the surface roughness (Ra) after the etching was 28.4 nm. From this, it can be found that the surface smoothness was improved by the etching.

Practical Example 5

Figure 4:
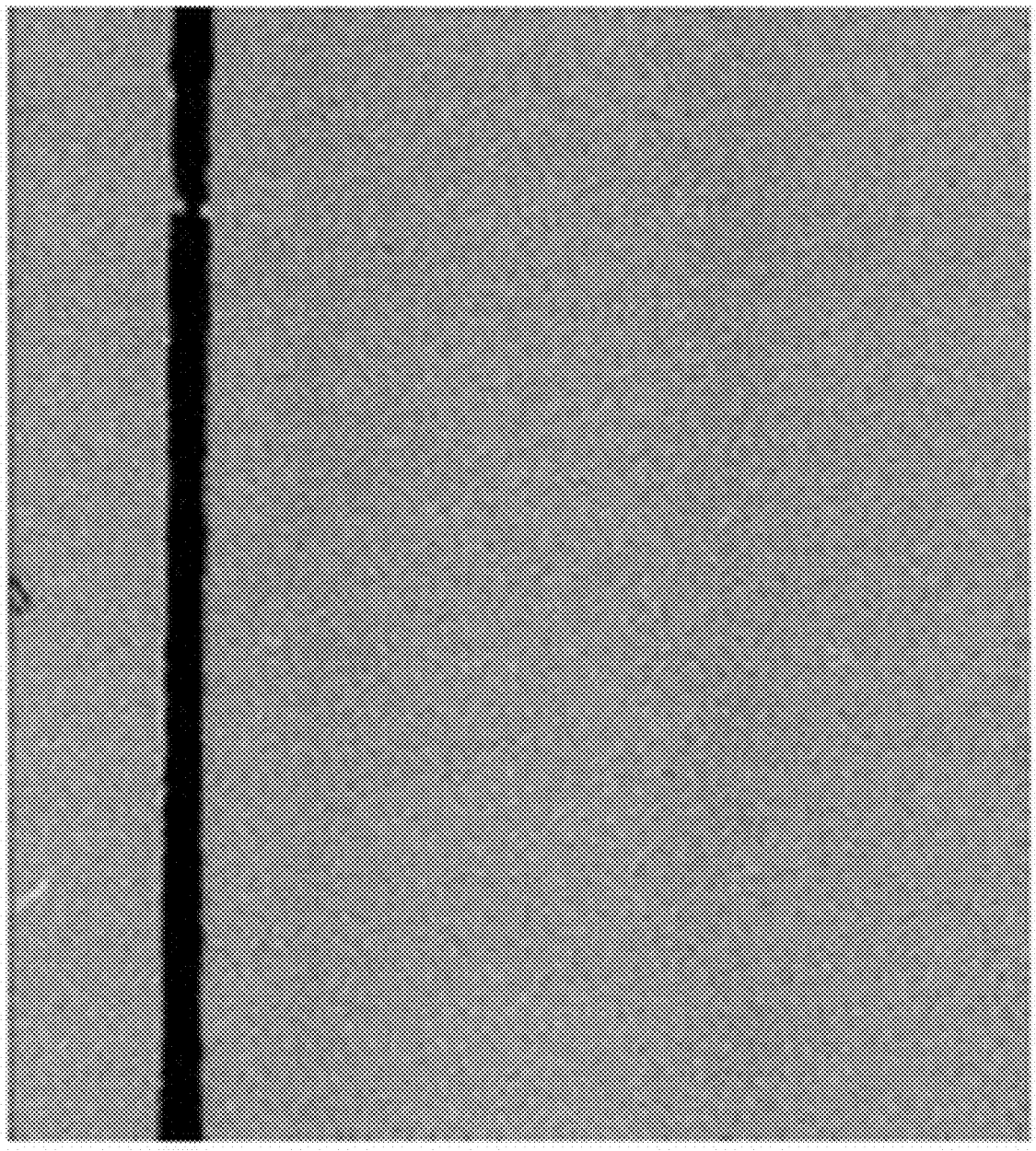
FIG. 4 shows a microscopic image after etching in a Practical Example.

Etching was given by the same conditions as the conditions of the Practical Example 4 except that the temperature of etching was 400° C. The amount of etching was 380 nm. Same as the Practical Example 1, after the etching, the object was observed to confirm presence or absence of crack(s) by a microscope. FIG. 4 shows the microscopic image. As clearly shown in FIG. 4, crack(s) was not generated by the etching. Also, the amount of etching was greater than the amount of etching in the Practical Example 3.

Practical Example 6

Etching was given by the same conditions as the conditions of the Practical Example 5 except that the etching liquid was prepared by mixing hydrobromic acid into ultrapure water such that hydrobromic acid becomes 30% in volume ratio. The amount of etching was 897 nm, and etching appearance was favorable.

Practical Example 7

Etching was given by the same conditions as the conditions of the Practical Example 1 except that an m-plane $\alpha$-$Ga_2O_3$ film formed on an m-plane sapphire substrate was used as the object to be etched. The amount of etching was 223 nm. Same as the Practical Example 1, after the etching, the object was observed to confirm presence or absence of crack(s) by a microscope, and found that crack(s) was not generated by etching.

Practical Example 8

Etching was given by the same conditions as the conditions of the Practical Example 2 except that the temperature of etching was 400° C. and an m-plane $\alpha$-$Ga_2O_3$ film formed on an m-plane sapphire substrate was used as the object to be etched. The amount of etching was 696 nm and the etching appearance was favorable. Same as the Practical Example 1, after the etching, the object was observed to confirm presence or absence of crack(s) by a microscope, and found that crack(s) was not generated by etching.

Practical Example 9

Etching was given by the same conditions as the conditions of the Practical Example 2 except that the temperature of etching was 400° C. and an a-plane $\alpha$-$Ga_2O_3$ film formed on an a-plane sapphire substrate was used as the object to be etched. The amount of etching was 305 nm and the etching appearance was favorable.

Comparative Example 3

Etching was given by the same conditions as the conditions of the Comparative Example 1 except that an m-plane $\alpha$-$Ga_2O_3$ film formed on an m-plane sapphire substrate was used as the object to be etched. The amount of etching was 0 nm.

Comparative Example 4

Etching was given by the same conditions as the conditions of the Comparative Example 2 except that an m-plane $\alpha$-$Ga_2O_3$ film formed on an m-plane sapphire substrate was used as the object to be etched. The amount of etching was 0 nm.

Comparative Example 5

Etching was given by the same conditions as the conditions of the Comparative Example 1 except that an r-plane $\alpha$-$Ga_2O_3$ film formed on an r-plane sapphire substrate was used as the object to be etched. The amount of etching was 0 nm.

Comparative Example 6

Etching was given by the same conditions as the conditions of the Comparative Example 2 except that an r-plane $\alpha$-$Ga_2O_3$ film formed on an r-plane sapphire substrate was used as the object to be etched. The amount of etching was 0 nm.

Comparative Example 7

Etching was given by the same conditions as the conditions of the Comparative Example 1 except that an a-plane $\alpha$-$Ga_2O_3$ film formed on an a-plane sapphire substrate was used as the object to be etched. The amount of etching was 0 nm.

Comparative Example 8

Etching was given by the same conditions as the conditions of the Comparative Example 2 except that an a-plane $\alpha$-$Ga_2O_3$ film formed on an a-plane sapphire substrate was used as the object to be etched. The amount of etching was 0 nm.

Practical Example 10

Etching was given similarly to the above by use of a potassium hydroxide solution as an etching liquid and a sapphire substrate as an object to be etched.

INDUSTRIAL APPLICABILITY

A method of etching of the present inventive subject matter is able to etch an object industriously advantageously, and thus, applicable to manufacturing process(es) of various products, and preferably applicable to manufacturing process(es) in various field of semiconductor devices and electronic devices.

REFERENCE NUMBER DESCRIPTION 1 a p-type semiconductor
2 an electrode (barrier electrode)
3 an n-type semiconductor layer
4 an ohmic electrode
19 an etching device
20 an object to be etched
22a a carrier gas supply device
22b a dilution carrier gas supply device
23a a flow-control valve of carrier gas
23b a flow-control valve of dilution carrier gas
24 a mist generator
24a an etching liquid
25 a container
25a water
26 an ultrasonic transducer
27 a supply pipe
28 a heater (hot plate)
29 an exhaust port
30 an etching chamber
131a an n⁻-type semiconductor layer
131b a first n⁺-type semiconductor layer
131c a second n⁺-type semiconductor layer
132 a p-type semiconductor layer
134 a gate insulation layer
135a a gate electrode
135b a source electrode
135c a drain electrode

What is claimed is:
1. A method of manufacturing a semiconductor device, the method comprising: manufacturing the semiconductor device by:

supplying a carrier gas and/or a dilution gas to a mist generator containing an etching liquid;

generating atomized droplets from the etching liquid using an ultrasonic transducer;

supplying the atomized droplets inside an etching chamber onto an object comprising a heated crystalline oxide semiconductor layer and/or a substrate inside the etching chamber; and etching the object comprising the crystalline oxide semiconductor layer and/or the substrate with the atomized droplets at a temperature higher than 200° C.

2. The method of claim 1, wherein the etching liquid comprises at least one selected from among bromide, a hydroxide, an alkali metal and an alkaline-earth metal.

3. The method of claim 1, wherein the temperature is 400° C. or higher.

4. The method of claim 1, wherein the carrier gas is an inert gas.

5. The method of claim 1, wherein the etching the object comprising the heated crystalline oxide semiconductor layer and/or the substrate comprises reforming a surface of the object.

6. The method of claim 1, wherein the object comprises at least aluminum.

7. The method of claim 1, wherein the object comprises at least gallium.

8. The method of claim 1, wherein the object comprises a corundum structure.

9. The method of claim 1, wherein the object comprises at least aluminum and gallium.

10. The method of claim 1, wherein the etching of the object comprises reforming a surface of the object.

11. The method of claim 1, wherein the carrier gas is an inert gas.

* * * * *